(12) United States Patent
Shin et al.

(10) Patent No.: US 6,482,728 B2
(45) Date of Patent: Nov. 19, 2002

(54) METHOD FOR FABRICATING FLOATING GATE

(75) Inventors: Kwang-Shik Shin, Seoul (KR); Sung-Nam Chang, Gyeonggi-do (KR); Jae-Woo Kim, Gyeonggi-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 10/053,792

(22) Filed: Jan. 18, 2002

(65) Prior Publication Data

US 2002/0094641 A1 Jul. 18, 2002

(30) Foreign Application Priority Data

Jan. 18, 2001 (KR) .............................. 01-2984

(51) Int. Cl.[7] .......................................... H01L 21/8247
(52) U.S. Cl. ....................................... 438/593; 438/734
(58) Field of Search ................................ 438/257–267, 438/593–594, 734, 719

(56) References Cited

U.S. PATENT DOCUMENTS 6,284,637 B1 * 9/2001 Chhagan et al. ............ 438/261
6,368,917 B1 * 4/2002 Kalnitsky et al. ........... 438/257

* cited by examiner

*Primary Examiner*—Richard Booth
(74) *Attorney, Agent, or Firm*—Marger Johnson & McCollom, P.C.

(57) ABSTRACT

A method for fabricating a floating gate in a non-volatile memory device and a floating gate fabricated using the same are provided. A conductive layer having upper and lower portions is formed over a substrate with field regions formed therein. A hard mask layer is formed over the conductive layer. Next, a photoresist pattern is formed over the hard mask layer. The hard mask layer is etched to form a hard mask pattern, using the photoresist pattern as an etching mask. The upper portion of the conductive layer is slope-etched, leaving the lower portion of the conductive layer intact, using the photoresist pattern as an etching mask. The slope-etched upper portion of the conductive layer is again vertically etched and the lower portion of the conductive layer is concurrently slope-etched, using the hard pattern as an etching mask. With the present invention, a bridge between floating gates can be reduced, and field loss can be reduced during processing steps such as an ONO etching process.

13 Claims, 10 Drawing Sheets

METHOD FOR FABRICATING FLOATING GATE

CROSS REFERENCE

This application claims the benefit of Korean Patent Application No. 2001-2984, filed on Jan. 18, 2001, under 35 U.S.C. §119, the entirety of which is hereby incorporated by reference.

BACKGROUND OF THE INVENTION

1. Field of the Invention

The present invention relates to a method for fabricating non-volatile memory devices and, more particularly, to a method for fabricating a floating gate.

2. Description of the Related Art

Generally, non-volatile memory devices comprise a stack gate structure including a floating gate for storing electric charge, and a control gate for accessing a memory for a read or write operation. It is known that the charge storing capability of the non-volatile memory devices relates to a coupling ratio C/R.

The coupling ratio C/R is a ratio, for example, between a tunnel oxide capacitance and an oxide-nitride-oxide ONO capacitance, and more particularly the ratio of the voltage applied to the control gate and the voltage coupled to the floating gate.

When storing data to a cell of the non-volatile memory device, the coupling ratio C/R ($V_{fg}/V_{cd}$, is $C_2(C_2+C_1)$, normally having a value of about 0.55 to 0.65. When erasing data from the cell of the non-volatile memory device, the coupling ratio C/R ($V_{fg}/V_{channel}$) is $C_1/(C_2+C_1)$, normally having a value of about 0.35 to 0.45. In this case, the $V_{fg}$ is a voltage applied to the floating gate, the $V_{cg}$ is a voltage applied to the control gate, and the $V_{channel}$ is a voltage applied to a channel. The capacitance $C_1$ is a coupling capacitance between a substrate and the floating gate and the capacitance $C_2$ is a coupling capacitance between the floating gate and the control gate.

Referring to FIG. 1, when a cell pitch is large, the floating gate having more than a predetermined coupling ratio C/R can be fabricated even when the height of the floating gate is about 1000 Å lower than the normal case. If the height of the floating gate is low, there is an advantage in that the sidewall of the floating gate can be vertically etched and this removes the possibility of a bridge between the floating gates. Also, the problem of the field regions being damaged during etching of an oxide-nitride-nitride (ONO) layer can be avoided.

However, as the cell pitch decreases, the height of the floating gate also increases to maintain the predetermined amount of the coupling ratio C/R. However, as the height of the floating gate increases, for example, about 3000 Å, the field regions can be damaged during etching of the ONO layer.

Referring to FIG. 2, to solve the above-mentioned problem, the sidewalls of the floating gates are sloped to lower the vertical thickness of the ONO layer. Therefore, the etching amount of the ONO layer is reduced so that damage to the field regions can be prevented.

However, sloped sidewalls of the floating gates increase the possibility of a bridge between the floating gates. Therefore, the sloped sidewall structure may be improper for the floating gate of the non-volatile memory devices having a smaller cell pitch (smaller spacing).

FIGS. 3 through 6 are cross sectional views illustrating the conventional method for fabricating a floating gate.

As shown in FIG. 3, a field region or device isolation layer 3 and a tunneling oxide is formed on a substrate 1 using conventional techniques. A lower polysilicon layer 7, a nitride layer 9 for forming an etching mask, and a sacrificial polysilicon layer 13 are sequentially formed on a substrate 1.

Referring to FIG. 4, after etching the lower polysilicon layer 7 and the nitride layer 9, a nitride layer is deposited over the resulting structure. Next, the deposited nitride layer is anisotropically etched to form sidewall spacers 15 on the lower polysilicon layer 7.

As shown in FIG. 5, using the sidewall spacer 15 as an etching mask, the lower polysilicon layer 7 and the sacrificial polysilicon layer 13 are etched together to form a floating gate pattern 7' having the width of 0.1 μm.

Referring to FIG. 6, the nitride layer 9 and the sidewall spacer 15 are removed by an etchant such as a phosphorous acid, and an inter-gate dielectric layer 10 of an ONO structure and a control gate 17 are formed over the floating gate pattern.

Then, portions of the floating gate pattern 7 and the gate insulation layer 10 are removed for source and drain areas of memory cells as shown in FIG. 7.

However, the above-mentioned conventional process is too complicated and generates damage to the polysilicon layer 7 when the phosphorous acid removes the nitride layer 9 and the sidewall spacers 15. Therefore, current leakage can occur through the inter-gate dielectric layer 10. Additionally, as shown in FIG. 6, because the conventional process performs an over-etching for complete removal of the inter-gate dielectric layer 10 formed in the sidewall of the floating gate 7. Therefore, as shown in FIG. 7, when the device isolation layer 3 is damaged in the area A, the subsequent ion implanting process generates a channel below the device isolation layer 3 and this deteriorates the device isolation characteristic.

SUMMARY OF THE INVENTION

To overcome the above-described problems, the present invention provide a method for fabricating a floating gate for non-volatile memory devices having a smaller cell pitch.

According to one embodiment of the present invention, a conductive layer having upper and lower portions is formed over a substrate with field regions formed therein. A hard mask layer is formed over the conductive layer. Next, a photoresist pattern is formed over the hard mask layer. The hard mask layer is etched to form a hard mask pattern, using the photoresist pattern as an etching mask. The upper portion of the conductive layer is slope-etched, leaving the lower portion of the conductive layer intact, using the photoresist pattern as an etching mask. The slope-etched upper portion of the conductive layer is vertically etched and the lower portion of the conductive layer is concurrently slope-etched, using the hard pattern as an etching mask.

According to another embodiment of the present invention, a conductive layer having upper and lower portions is formed over a substrate with field regions formed therein. A hard mask layer is formed overlying the conductive layer. A photoresist pattern is formed on hard mask layer. Next, slope etching of the hard mask layer to form hard mask pattern having sloped sidewalls, using the photoresist pattern as an etching mask, is performed. Then, the photoresist pattern is removed. The upper portion of the conductive layer is vertically etched, leaving the lower portion of the conductive layer un-etched or intact, using the hard mask pattern as an etching mask. The remaining lower portion of the conductive layer is vertically etched using an etch chemistry having substantially no etch selectivity between the hard mask layer and the conductive layer and sloping etching the upper portion of the conductive layer.

With the embodiments of the present invention, a bridge between floating gates can be reduced, and field loss can be reduced during processing steps such as an ONO etching process.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to preferred embodiments of the present invention, example of which is illustrated in the accompanying drawings. The same area or structure in diagrams will be illustrated as the same notes or character.

FIGS. 8 to FIG. 11 are cross sectional view illustrating processing steps to fabricate floating gates according to one embodiment of the present invention.

Figure 1:
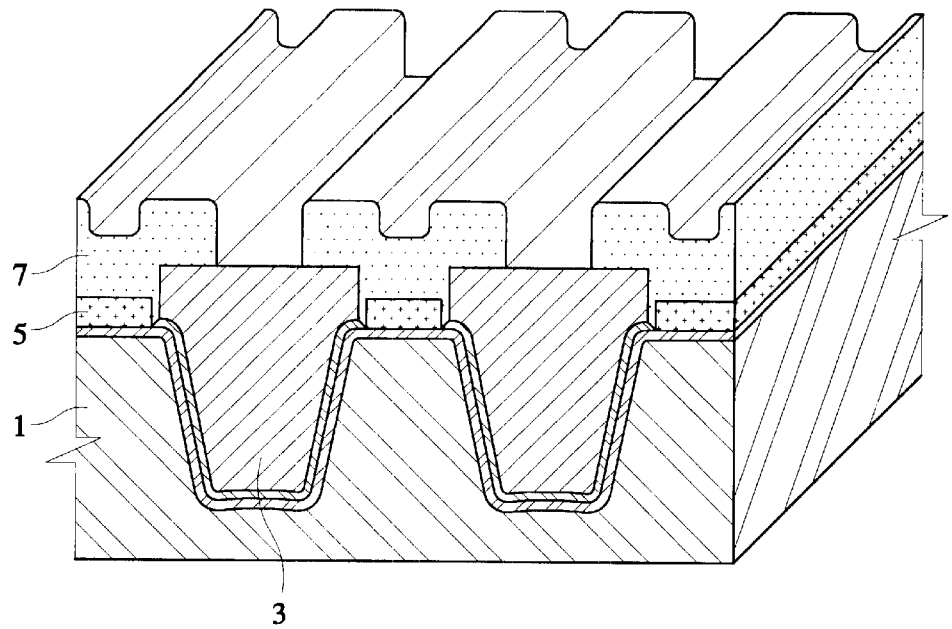
FIG. 1 is a cross sectional diagram illustrating a structure of a conventional floating gate.
Figure 2:
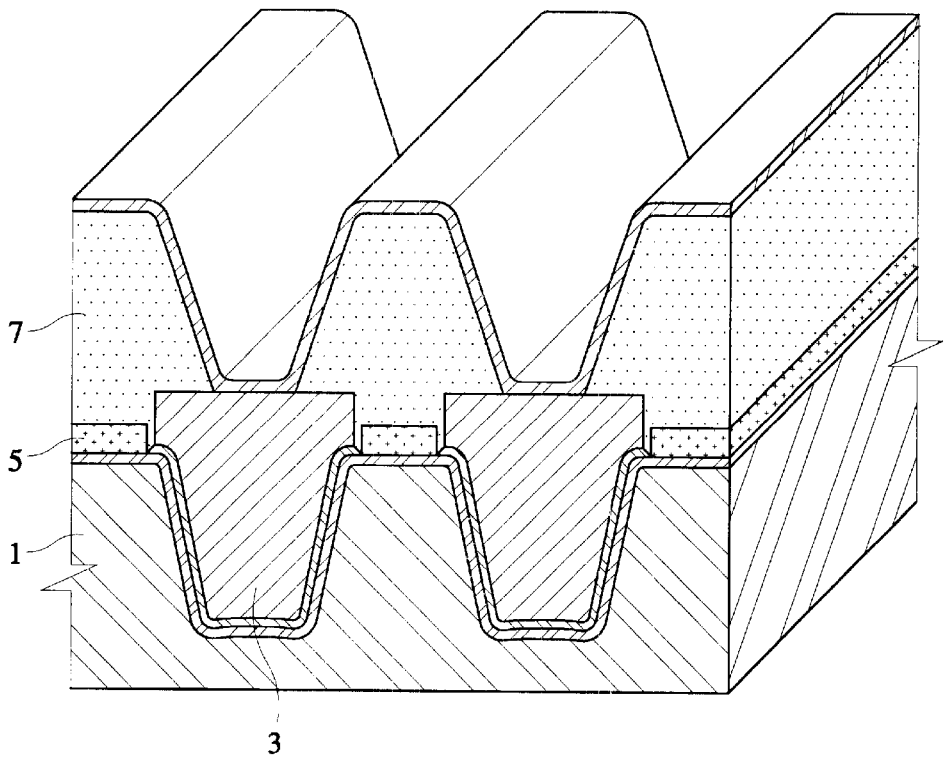
FIG. 2 is a cross sectional diagram illustrating a structure of another conventional floating gate.
Figure 3:
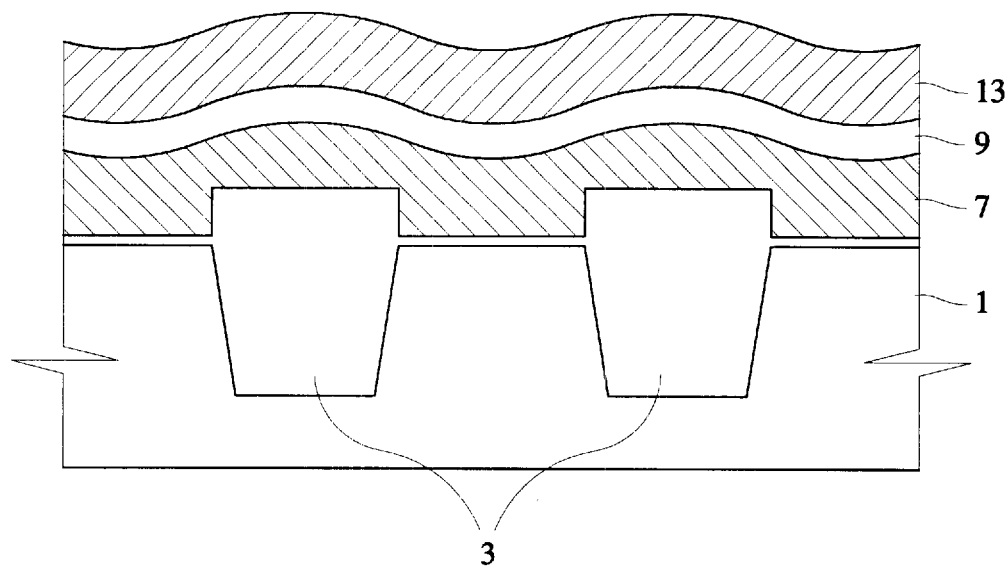
FIG. 3 to FIG. 6 are cross sectional diagrams illustrating the conventional procedures for fabricating floating gate.
Figure 4:
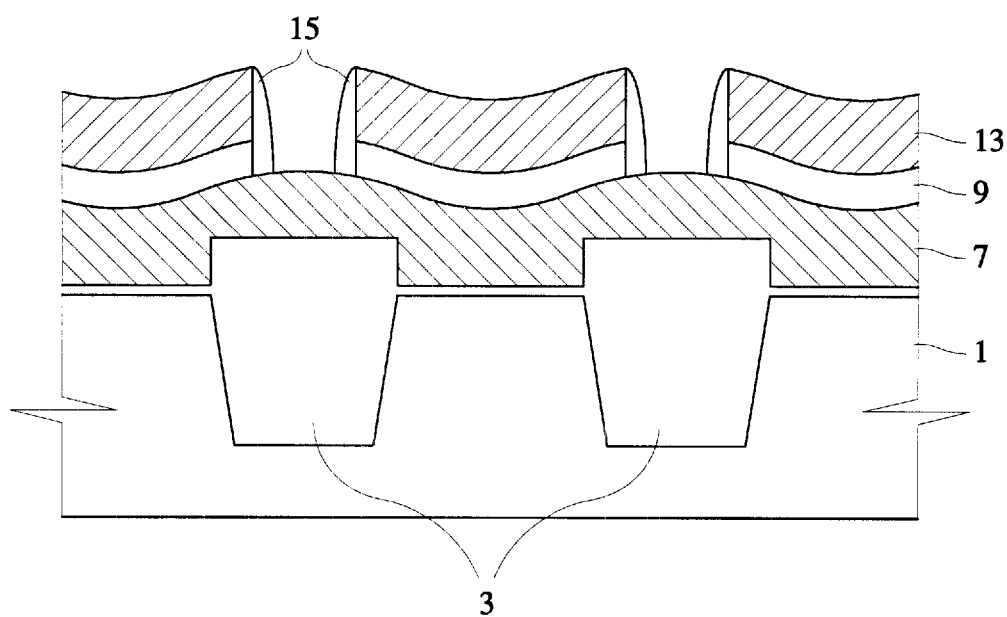
Figure 5:
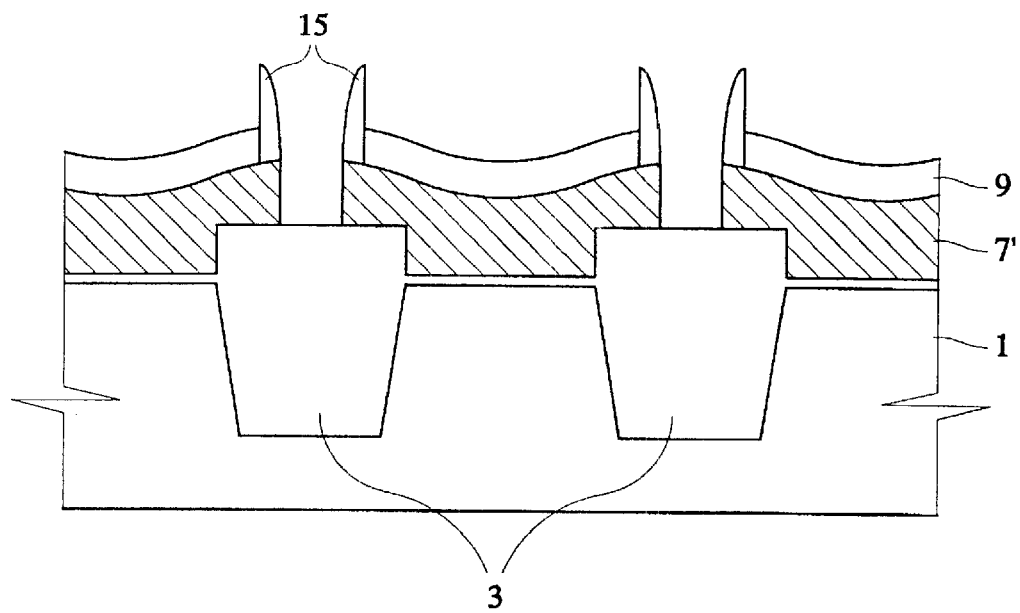
Figure 6:
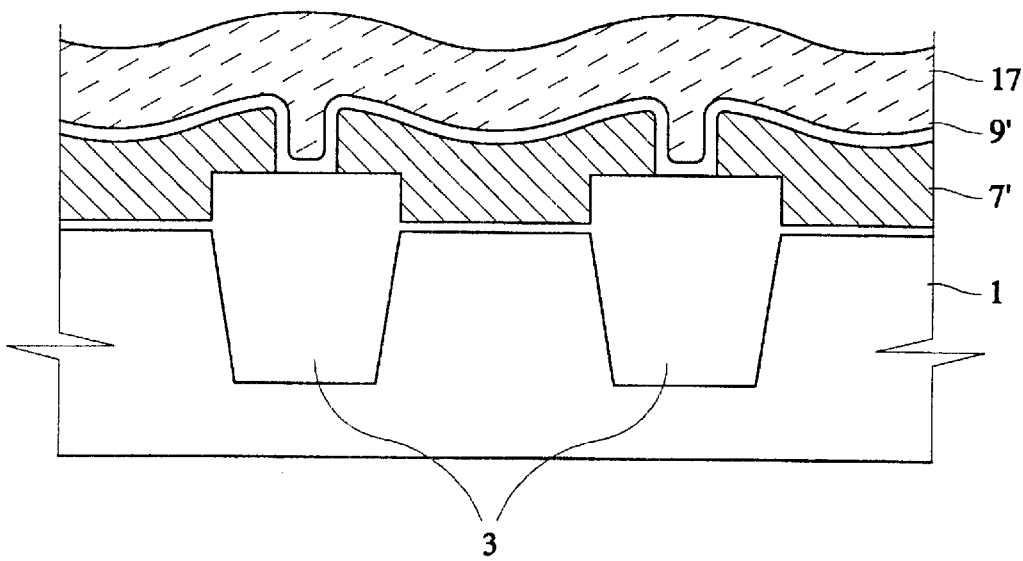
Figure 7:
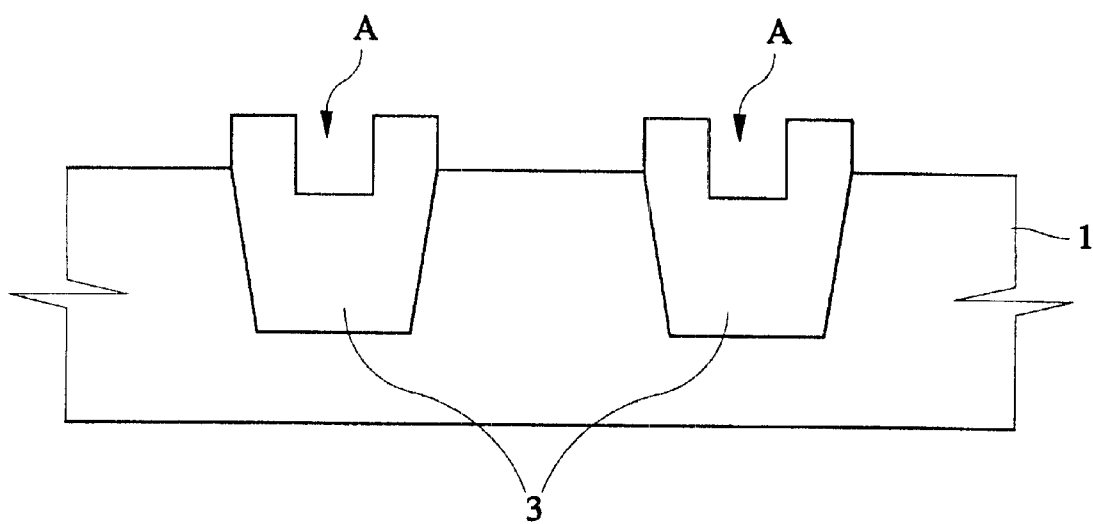
FIG. 7 is a cross sectional diagram illustrating damage to a device isolation layer resulting from over-etching of the conventional procedures for fabricating floating gate.
Figure 8:
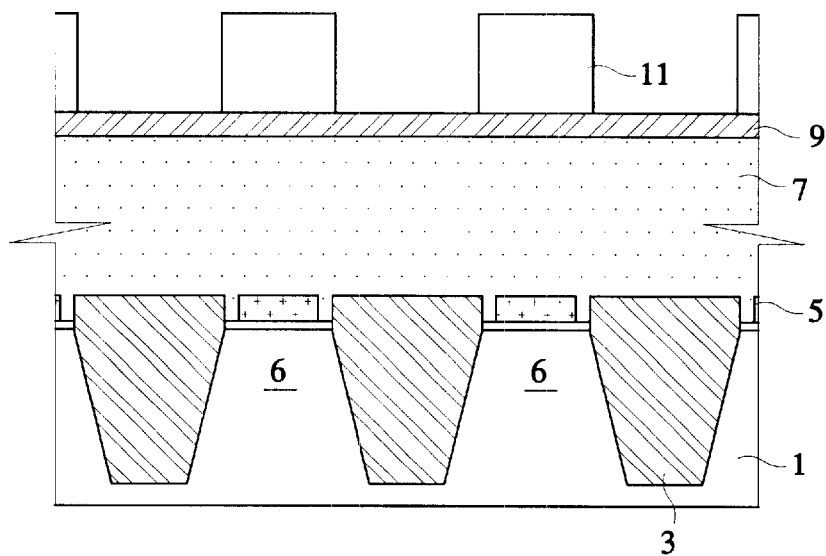
FIGS. 8 to FIG. 11 are cross sectional diagrams illustrating the procedures for fabricating floating gate according to a preferred embodiment of the present invention.

Referring to FIG. 8, a tunnel dielectric layer such as an oxide layer (not shown) is formed on a semiconductor substrate such as a silicon substrate 1 with field regions 3 that define an active region 6. Then, a conductive layer such as a polysilicon layer 7 for forming a floating gate, and a hard mask layer such as a nitride layer 9 for forming a hard mask pattern are sequentially deposited over the substrate 1. Next, a photoresist pattern 11 is formed on the nitride layer 9 to form a hard mask pattern 9' (FIG. 9).

Figure 9:
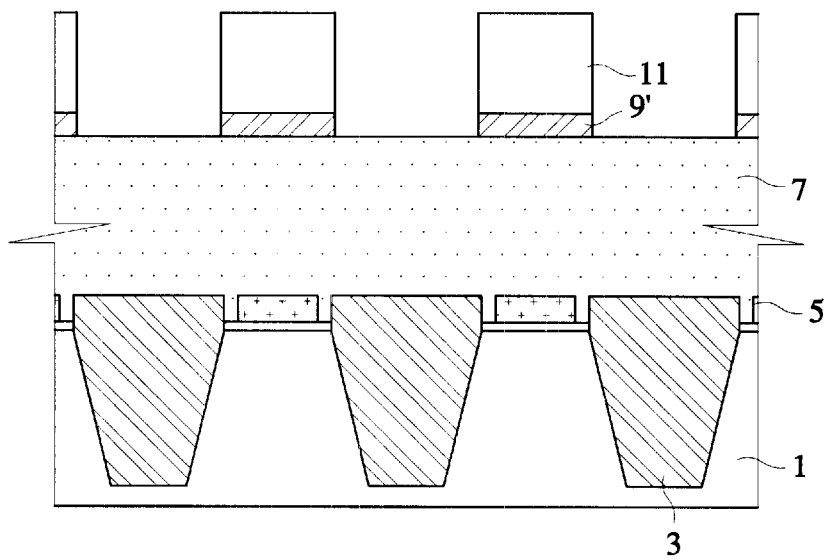

Referring to FIG. 9, the nitride layer 9 is patterned, i.e., etched using the photoresist pattern 11 as an etching mask to form the hard mask pattern 9'. The hard mask pattern 9' preferably has vertical sidewalls as illustrated.

Figure 10A:
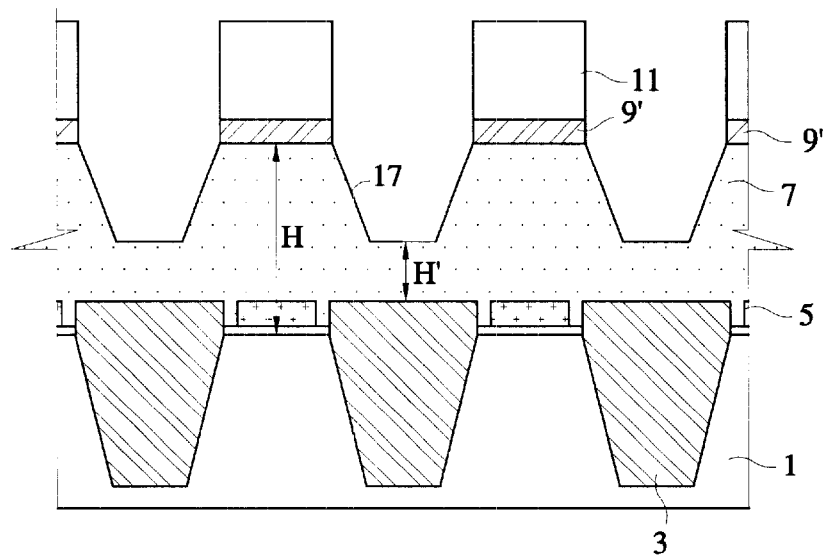
Figure 10B:
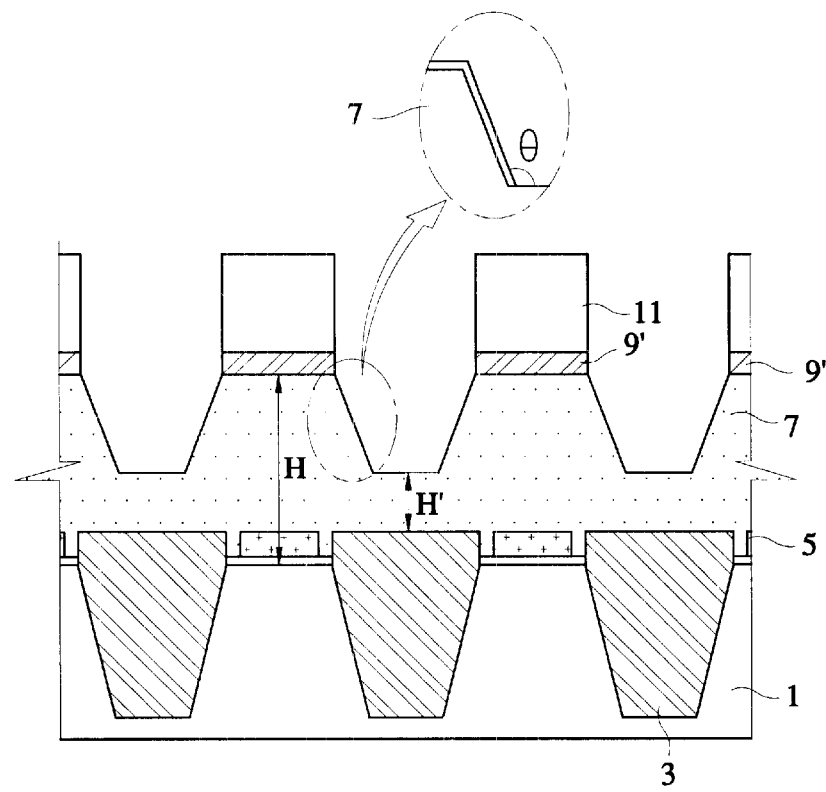

Turning to FIG. 10A and 10B, slope etching of the upper portion of the polysilicon layer 7 is performed using conventional techniques to have sloped sidewalls 17 thereof, using the photoresist pattern 11 as an etching mask.

The etching gradient θ, the angle of the inclination as shown in FIG. 10b, is preferably 90° to 100°, and the etching depth H' is preferably ½ H to ⅓ H. Further, the lower portion of the polysilicon layer 7 remains un-etched or intact.

Figure 11:
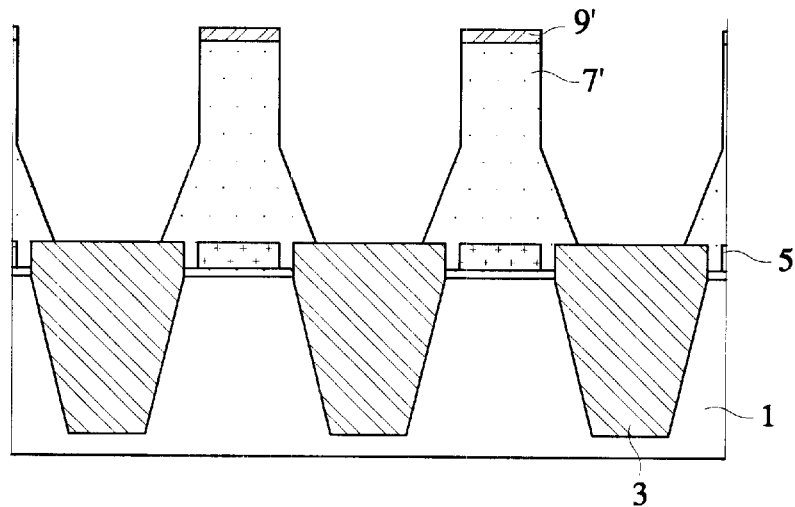

Referring to FIG. 11, after removing the photoresist pattern 11, the slope-etched portion of the polysilicon layer 7 is again etched vertically with the hard mask pattern 9' using an etch chemistry having substantially no etch selectivity between the hard mask pattern 9' and the polysilicon layer 7. For this, etching process conditions such as flow rates, pressure, and gas are adjusted, as is known in the art. Also, during this etching process, the slope of the upper portion of the polysilicon layer 7 is transcribed or translated into the lower portion of the polysilicon layer 7. Accordingly, floating gates 7' are formed.

Figure 12:
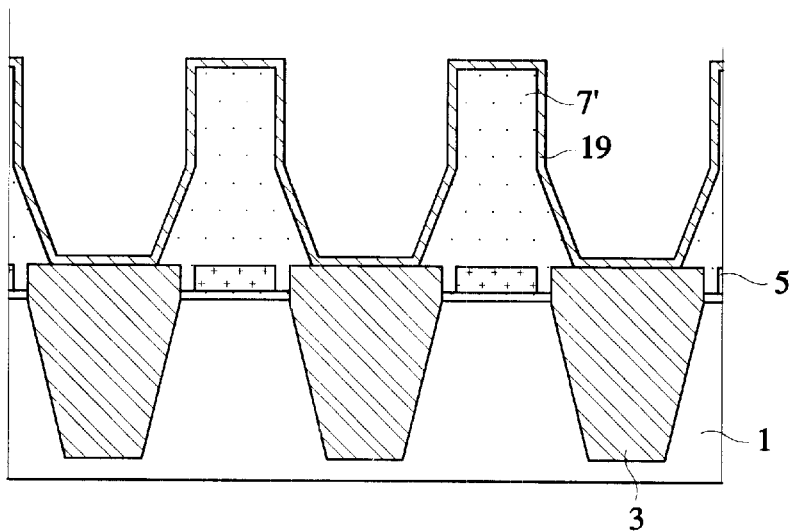
FIG. 12 is a cross sectional diagram of the floating gate generated according to the preferred embodiment of the present invention.

Thus, with an embodiment of the present invention, a floating gate is formed, where the upper portion of the floating gate 7' is vertical and the lower portion of the floating gate 7' is sloped, as shown in FIG. 12. Therefore, a bridge between the floating gates 7' can be prevented, and the damage to the field regions 3 can also be reduced, during the formation of processing steps such as ONO etching.

Then, after performing a phosphorous strip process or other suitable processes to remove the hard mask pattern 9' on top of the floating gate 7', an inter-gate dielectric layer 19 formed of a conventional material such as oxide-nitride-nitride (ONO) is formed on the floating gate 7'.

Next, a conductive layer such as a polycide layer is deposited on the inter-gate dielectric layer 19 to form a control gate.

Subsequently, a non-volatile memory such as a flash memory device is completed using conventional techniques.

FIGS. 13 to FIG. 16 are cross-sectional views illustrating another embodiment for fabricating a floating gate. In this embodiment, the upper portion of the floating gate 7' is sloped and the lower portion of the floating gate 7' has substantially vertical sidewalls in contrast with the embodiment discussed above.

Figure 13:
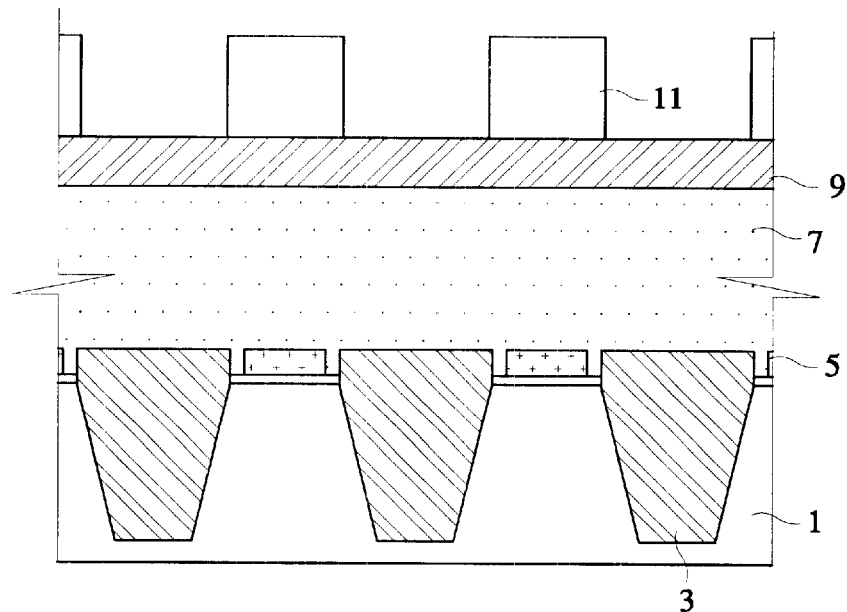
FIGS. 13 to FIG. 16 are cross sectional diagrams illustrating another floating gate fabricating procedures according to another preferred embodiment of the present invention.

Referring to FIG. 13, the processing steps described above in connection with FIG. 8 are performed. Thus, a conductive layer such as a polysilicon layer 7 having upper and lower portions is formed on a semiconductor substrate, e.g., silicon substrate 1 with field regions 3 formed therein. Then, a hard mask layer such as a nitride layer 9 to form hard mask pattern 9' (FIG. 14) is deposited on the polysilicon layer 7. Subsequently, a photoresist pattern 11 is formed on the nitride layer 9.

Figure 14:
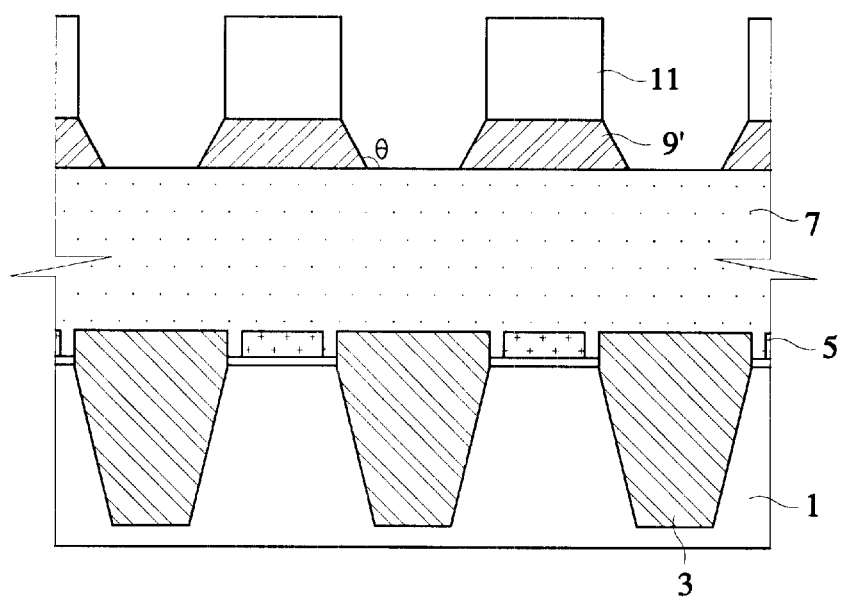

Referring to FIG. 14, the hard mask pattern 9' is formed having sloped sidewalls using the photoresist pattern 11 as an etching mask. In this case, a slope etching process is performed over the resulting structure. Preferably, the etching gradient θ is between approximately 90° to 100°. The etching depth H1 of this slope etching is ½ H0 to ⅓ H0 while the height H0 is the height of the conductive layer 7.

Figure 15:
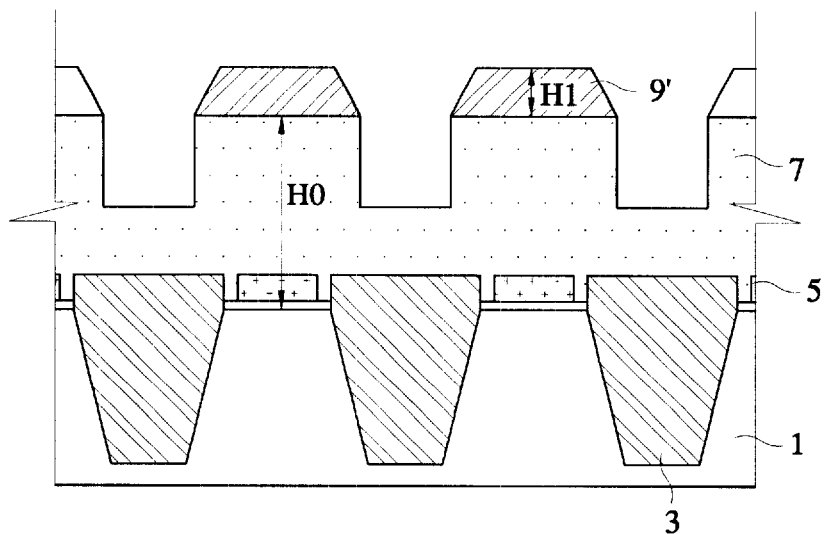

After removing the photoresist pattern 11 of FIG. 14, the upper portion of the polysilicon layer 7 is dry-etched vertically using the hard mask pattern 9' having sloped sidewalls as an etching mask, as shown in FIG. 15. In this case, the lower portion of the polysilicon layer 7 remains un-etched or intact.

Figure 16:
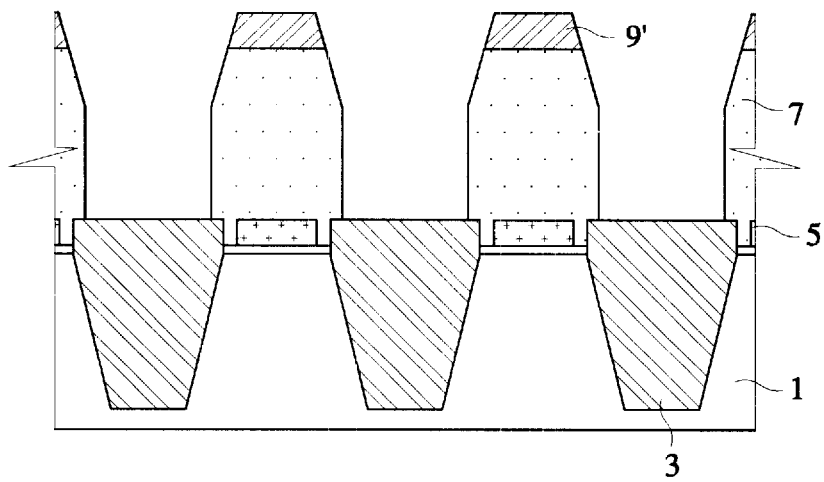

Turning to FIG. 16, a vertical dry-etching process is performed on the lower portion of the polysilicon layer 7 using an etch chemistry having substantially no etch selectivity between the hard mask pattern 9' and the polysilicon layer 7 such that substantially no damage between the hard mask pattern 9' and the polysilicon layer 7 occur. Also, during this vertical dry-etching process, the sloped sidewalls of the hard mask pattern 9' is transcribed or translated into the upper portion of the floating gate 7' while the lower portion of the floating gate 7' is formed vertically.

Figure 17:
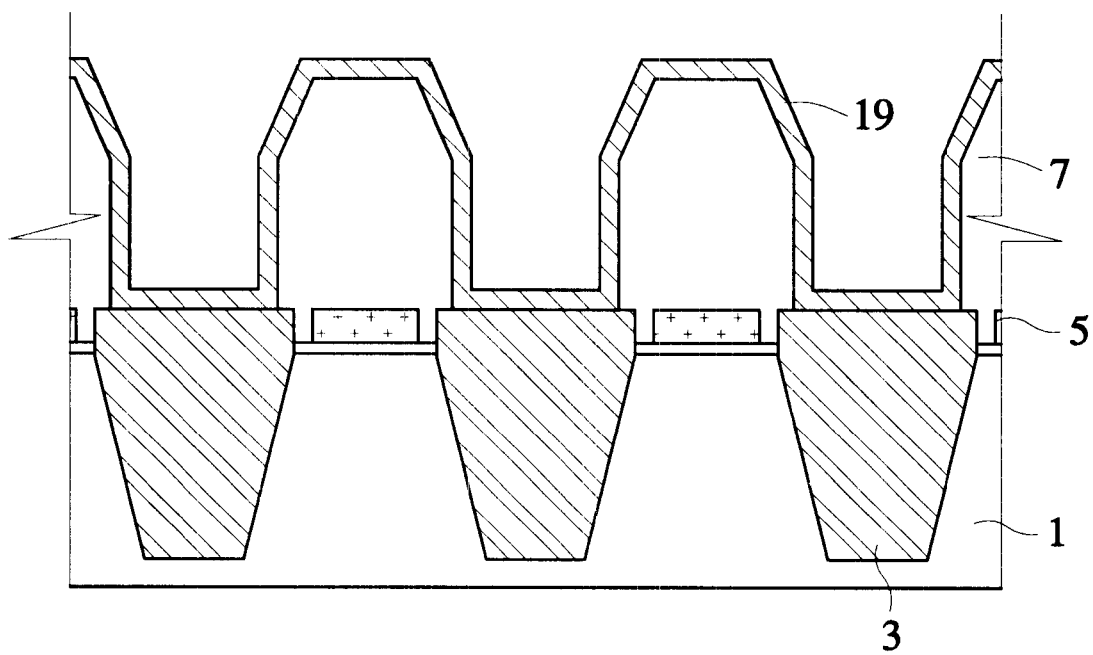
FIG. 17 is a cross sectional diagram of another floating gate generated according to another preferred embodiment of the present invention.

As a result, the floating gate 7' is formed as shown in FIG. 17. Additionally, the hard mask pattern 9' placed on top of the floating gate 7' is removed using conventional techniques such as a phosphorous strip process. Then, an inter-gate dielectric layer 19 such as an ONO layer is formed on the floating gate 7' as shown to form a non-volatile memory gate stack.

As described above, the present invention provides a method for fabricating floating gate applicable to a non-volatile memory such as a flash memory having a smaller cell pitch, wherein bridges between the floating gates are reduced, and the field loss is reduced during processing steps such as an ONO etching process. In other words, a portion (the upper portion or the lower portion) of the floating gate is sloped to reduce the problem of field loss or field recess during processing steps such as the ONO etching process, even though the height of the floating gate is high. Additionally, vertical etching of the other portion (the lower portion or the upper portion) of the floating gate can reduce bridges between the floating gates.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for fabricating a floating gate in a non-volatile memory device, the method comprising:
   forming a conductive layer having upper and lower portions over a substrate with field regions formed therein;
   forming a hard mask layer over the conductive layer;
   forming a photoresist pattern over the hard mask layer;
   etching the hard mask layer to form a hard mask pattern, using the photoresist pattern as an etching mask;
   slope-etching the upper portion of the conductive layer, leaving the lower portion of the conductive layer un-etched, using the photoresist pattern as an etching mask; and
   vertically etching the slope-etched upper portion of the conductive layer and concurrently slope-etching the lower portion of the conductive layer, using the hard mask pattern as an etching mask.

2. The method of claim 1, further comprising:
   removing the hard mask pattern by performing a phosphorous strip process.

3. The method of claim 1, wherein etching the hard mask layer comprises:
   vertically etching the hard mask layer to form a hard mask pattern using the photoresist pattern as an etching mask.

4. The method of claim 1, wherein the thickness of the un-etched lower portion of the conductive layer is ½ to ⅓ times the total thickness of the conductive layer.

5. The method of claim 1, wherein the etching gradient of the slope etching of the upper portion of the conductive layer is approximately 90° to approximately 100°.

6. The method of claim 1, wherein the hard mask layer comprises nitride.

7. The method of claim 1, wherein the slop etching and the vertical etching each comprise a dry etching process.

8. The method of claim 1, wherein the conductive layer comprises polysilicon.

9. A method for fabricating a floating gate in a non-volatile memory device, the method comprising:
   forming a conductive layer having upper and lower portions over a substrate with field regions formed therein;
   forming a hard mask layer overlying the conductive layer;
   forming a photoresist pattern on hard mask layer;
   slope etching the hard mask layer to form a hard mask pattern having sloped sidewalls, using the photoresist pattern as an etching mask;
   removing the photoresist pattern;
   vertically etching the upper portion of the conductive layer, leaving the lower portion of the conductive layer un-etched, using the hard mask pattern as an etching mask; and
   vertically etching the remaining lower portion of the conductive layer, using an etch chemistry having substantially no etch selectivity between the hard mask pattern and the conductive layer, and slope etching the upper portion of the conductive layer.

10. The method of claim 9, wherein the hard mask layer comprises nitride.

11. The method of claim 9, further comprising: removing the hard mask pattern by performing a phosphorous strip process.

12. The method of claim 9, wherein the etching depth H1 of the slope etching of the hard mask layer is ½ H0 to ⅓ H0, in which the height H0 is the height of the conductive layer.

13. The method of claim 9, wherein the etching gradient of the slope etching of the hard mask layer is about 90° to about 100°.

* * * * *